(12) United States Patent
Hori et al.

(10) Patent No.: US 12,323,127 B2
(45) Date of Patent: Jun. 3, 2025

(54) COMPOSITE SUBSTRATE, ELASTIC WAVE ELEMENT, AND PRODUCTION METHOD FOR COMPOSITE SUBSTRATE

(71) Applicant: NGK INSULATORS, LTD., Nagoya (JP)

(72) Inventors: Yuji Hori, Owariasahi (JP); Takahiro Yamadera, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 828 days.

(21) Appl. No.: 17/546,551

(22) Filed: Dec. 9, 2021

(65) Prior Publication Data
US 2022/0103156 A1 Mar. 31, 2022

Related U.S. Application Data

(63) Continuation of application No. PCT/JP2020/006280, filed on Feb. 18, 2020.

(30) Foreign Application Priority Data

Jun. 11, 2019 (JP) .................................. 2019-108403

(51) Int. Cl.
*H03H 9/02* (2006.01)
*H03H 3/08* (2006.01)
*H03H 9/25* (2006.01)

(52) U.S. Cl.
CPC .......... *H03H 9/02574* (2013.01); *H03H 3/08* (2013.01); *H03H 9/02559* (2013.01); *H03H 9/25* (2013.01)

(58) Field of Classification Search
CPC ... H03H 9/02574; H03H 9/02559; H03H 9/25
USPC ...... 310/313 R, 313 A, 313 B, 313 C, 313 D
See application file for complete search history.

(56) References Cited

U.S. PATENT DOCUMENTS

| | | | |
|---|---|---|---|
| 10,084,427 B2 | 9/2018 | Solal et al. | |
| 2018/0048282 A1 | 2/2018 | Kurimoto et al. | |
| 2019/0326878 A1* | 10/2019 | Kakita | ................. H03H 9/6483 |
| 2020/0067480 A1 | 2/2020 | Tai et al. | |

FOREIGN PATENT DOCUMENTS

| | | |
|---|---|---|
| JP | 2018-26695 A | 2/2018 |
| JP | 2018-207355 A | 12/2018 |
| WO | 2018-203430 A1 | 11/2018 |

OTHER PUBLICATIONS

Shogo Inoue et al., Spurious Free SAW Resonators on Layered Substrate with Ultra-High Q, High Coupling and Small TCF, IEEE International Ultrasonic Symposium 2018 Proceedings (4 pages).

(Continued)

*Primary Examiner* — Derek J Rosenau
(74) *Attorney, Agent, or Firm* — FLYNN THIEL, P.C.

(57) ABSTRACT

A composite substrate includes a supporting substrate composed of quartz, a piezoelectric material substrate, a first amorphous layer present between the supporting substrate and piezoelectric material substrate, and a second amorphous layer present between the supporting substrate and first amorphous layer. The first amorphous layer contains 10 to 30 atom % of silicon atoms, and the second amorphous layer contains 1 to 10 atom % of fluorine atoms.

5 Claims, 5 Drawing Sheets

(56) References Cited

OTHER PUBLICATIONS

Michio Kadota et al., Suprious-Free, Near-Zero-TCF Hetero Acoustic Layer (HAL) Saw Resonators Using LiTaO3 Thin Plate on Quartz, IEEE International Ultrasonic Symposium 2018 Proceedings (4 pages).
Q.-Y. Tong and U. Gösele, Semiconductor Wafer Bonding: Science and Technology, The Electrochemical Society Series, Wiley-Inter Science, pp. 24-29 (11 pages).
International Search Report, with English translation, issued in corresponding International Application No. PCT/JP2020/006280, date of mailing Apr. 7, 2020 (5 pages).
Written Opinion of International Searching Authority issued in corresponding International Application No. PCT/JP2020/006280, date of mailing Apr. 7, 2020 (3 pages).
English Translation of the International Preliminary Report on Patentability, issued in corresponding International Application No. PCT/JP2020/006280 Date of Mailing Dec. 23, 2021 (5 pages).

\* cited by examiner

Heating temperature and bonding strength

● Inventive Example

COMPOSITE SUBSTRATE, ELASTIC WAVE ELEMENT, AND PRODUCTION METHOD FOR COMPOSITE SUBSTRATE

CROSS-REFERENCE TO RELATED APPLICATIONS

This is a continuation of PCT/JP2020/006280, filed Feb. 18, 2020, which claims priority to Japanese Application No. JP2019-108403 filed on Jun. 11, 2019, the entire contents of which are hereby incorporated by reference.

TECHNICAL FIELD

The present invention is related to a composite substrate of a piezoelectric material substrate and supporting substrate, and a method of producing the same.

BACKGROUND ARTS

It has been widely used an SOI substrate composed of a high resistance Si, an $SiO_2$ thin film and an Si thin film, for realizing a high-performance semiconductor element. Plasma activation is applied for realizing the SOI substrate. This is because the bonding can be performed at a relatively low temperature (400° C.). It is proposed a composite substrate composed of the similar Si, $SiO_2$ thin film and piezoelectric thin film, for improving the performance of a piezoelectric device.

Further, for improving the temperature characteristic and Q value of an SAW filter, it is reported an SAW filter having the structure of bonding a supporting substrate and piezoelectric material substrate. Specifically, it is reported that an acoustic wave device applying a composite substrate, having the structure of bonding a quartz substrate and lithium tantalate substrate, provides excellent performance (non-patent documents 1 and 2 and patent documents 1 and 2).

(Non-Patent Document 1)
Shogo Inoue et. al. "Spurious Free SAW Resonators on Layered Substrate with Ultra-High Q, High Coupling and Small TCF", IEEE International Ultrasonic Symposium 2018 Proceedings
(Non-Patent Document 2)
Michio Kadota et. al. "Spurious-Free, Near-Zero-TCF Hetero Acoustic Layer (HAL) SAW Resonators Using $LiTaO_3$ Thin Plate on Quartz", IEEE International Ultrasonic Symposium 2018 Proceedings
(Non-Patent Document 3)
SEMICONDUCTOR WAFER BONDING, Q.-Y. Tong, U. Gosele, Wiley-Inter Science. P. 27
(Patent document 1) U.S. Pat. No. 10,084,427 B2
(Patent document 2) Japanese Patent Publication No. 2018-026695A

SUMMARY OF THE INVENTION

According to such composite substrate, thinning of the piezoelectric material substrate is the requirement of design. However, as the thickness of the piezoelectric material substrate is generally smaller, a strong bonding strength is necessary. For example, although it is proposed a bonded body of quartz and piezoelectric layer in patent document 2, in the case that the piezoelectric material substrate is thinned, there is a problem of the separation from the supporting substrate. Further improvement of the bonding strength is demanded.

An object of the present invention is, in bonding a supporting substrate made of quartz and a piezoelectric material substrate, to improve the bonding strength to prevent the separation, even in the case that the piezoelectric material substrate is thinned.

The present invention provides a composite substrate comprising:
a supporting substrate comprising quartz;
a piezoelectric material substrate;
a first amorphous layer present between the supporting substrate and the piezoelectric material substrate; and
a second amorphous layer present between the supporting substrate and the first amorphous layer,
wherein the first amorphous layer contains 10 to 30 atom % of silicon atoms, and
wherein the second amorphous layer contains 1 to 10 atom % of fluorine atoms.

Further, the present invention provides an acoustic wave device comprising:
the composite substrate; and
an electrode on said piezoelectric material substrate.

Further, the present invention provides a method of producing a composite substrate comprising a supporting substrate comprising quartz and a piezoelectric material substrate, said method comprising the steps of;
irradiating a plasma containing at least one of oxygen gas and nitrogen gas onto a surface of said supporting substrate to generate an activated surface;
irradiating a plasma containing at least one of oxygen gas and nitrogen gas onto a surface of said piezoelectric material substrate to generate an activated surface;
contacting the activated surface of the supporting substrate and the activated surface of the piezoelectric material substrate to obtain a bonded body; and
subjecting the bonded body to a thermal treatment at a temperature of 250° C. or higher and 350° C. or lower.

When a piezoelectric material substrate and a supporting substrate composed of quartz are directly bonded with each other, the inventors tried the method of subjecting the surfaces of the piezoelectric material substrate and supporting substrate to surface activation by plasma irradiation, of contacting and bonding the respective activated surfaces with each other and of performing the thermal treatment. During the trial, it is found that the bonding strength can be considerably improved to prevent the separation of the piezoelectric material substrate from the supporting substrate in the case that the piezoelectric material substrate is thinned by the processing, by performing the thermal treatment at a temperature of 250° C. or higher.

As the inventors have further studied the reason that the bonding strength is improved, the following findings are obtained. That is, in the composite substrate having the improved bonding strength, a plurality of amorphous layers is present between the supporting substrate and piezoelectric material substrate. As the amorphous layers are analyzed, it is found that the bonding strength is particularly improved to suppress the separation of the piezoelectric material substrate even when the piezoelectric material substrate is thinned, in the case that the amorphous layer containing 10 to 30 atom % of silicon atoms and the amorphous layer containing 1 to 10 atom % of fluorine atoms are provided. The present invention is thus made.

Although the reason of such action and effect is not clear, it can be speculated as follows. Silicon atoms are diffused from the supporting substrate of quartz to the piezoelectric material substrate side so that the amorphous layer containing 10 to 30 atom % of silicon atoms is generated, and fluorine atoms generated by the plasma activation are absorbed into the side of the piezoelectric material substrate so that the amorphous layer containing 1 to 10 atom % of fluorine atoms is generated, resulting in the substantial improvement of the bonding strength. As the temperature of the thermal treatment is low, it is considered that the diffusion of silicon atoms and diffusion of fluorine atoms in the atmosphere are suppressed so that the improvement of the bonding strength is suppressed.

Further, it is considered that fluorine atoms in the compositions of the amorphous layers are derived from fluorine-based rubber (perfluoro carbon polymer) constituting an O-ring of a plasma treatment chamber.

Further, according to the description of the patent document 2, although the supporting substrate composed of quartz and piezoelectric material substrate composed of lithium tantalate are bonded, an amorphous silicon oxide layer or amorphous alumina layer is film-formed on the surface of the supporting substrate or surface of the piezoelectric material substrate before the bonding, followed by thermal treatment at 150 to 200° C. On the other hand, according to the method of the present invention, the respective surfaces of the supporting substrate composed of quartz and piezoelectric material substrate composed of lithium tantalate or the like are subjected to surface activation by plasma containing at least one of oxygen gas and nitrogen gas, followed by the direct bonding and thermal treatment at 250° C. or higher. A plurality of the amorphous layers having the specific compositions are generated along the bonding interface at this stage.

MODES FOR CARRYING OUT THE INVENTION

The present invention will be described in detail below, appropriately referring to the attached drawings.

Figure 1A:
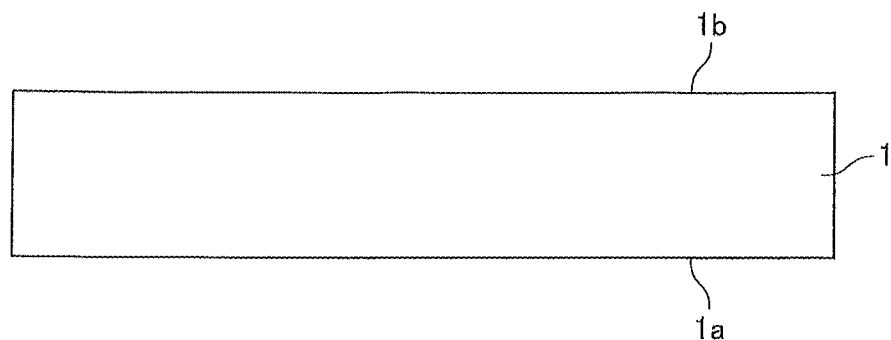
FIG. 1($a$) shows a piezoelectric material substrate 1, and FIG. 1($b$) shows the state that a bonding surface 1$a$ of the piezoelectric material substrate 1 is activated to generate an activated surface 1$c$.
Figure 1B:
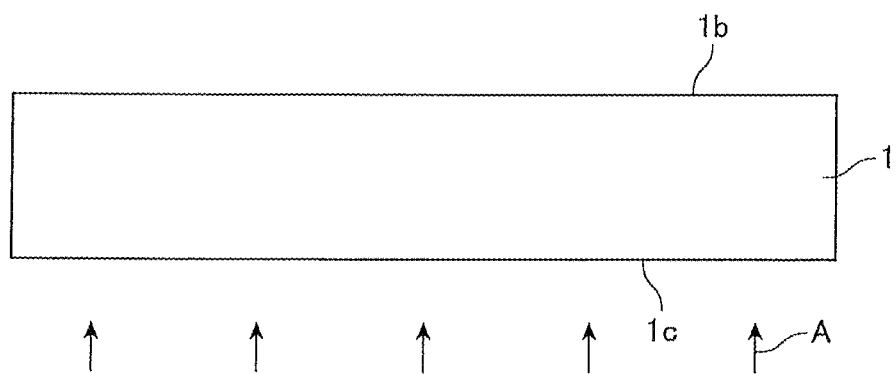

First, as shown in FIG. 1($a$), it is prepared a piezoelectric material substrate 1 having a pair of main surfaces 1$a$ and 1$b$. According to the present example, 1$a$ is selected as a bonding surface. Then, as shown in FIG. 1($b$), plasma is irradiated onto the bonding surface 1$a$ of the piezoelectric material substrate 1 as an arrow A, to obtain an activated bonding surface 1$c$.

Figure 2A:
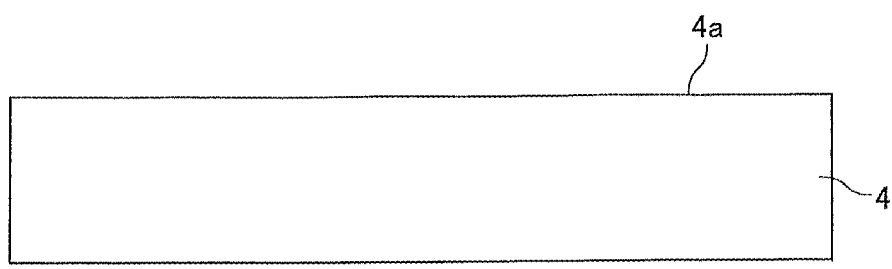
FIG. 2 ($a$) shows a supporting substrate 4, and FIG. 2($b$) shows the state that a surface of the supporting substrate 4 is activated.
Figure 2B:
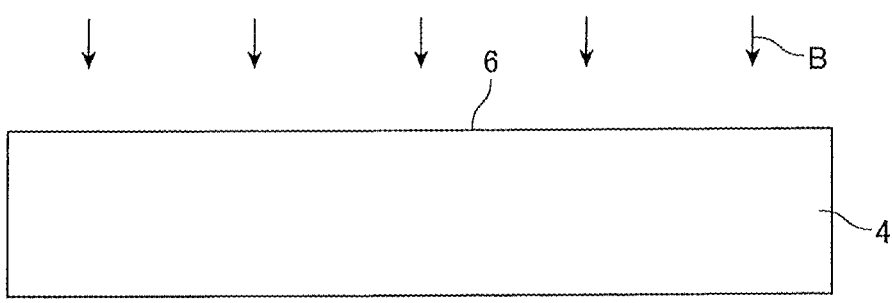

On the other hand, as shown in FIG. 2($a$), it is prepared a supporting substrate 4. Then, as shown in FIG. 2($b$), plasma is irradiated onto the surface 4$a$ of the supporting substrate 4 as an arrow B for performing the surface activation, to form an activated bonding surface 6.

Figure 3A:
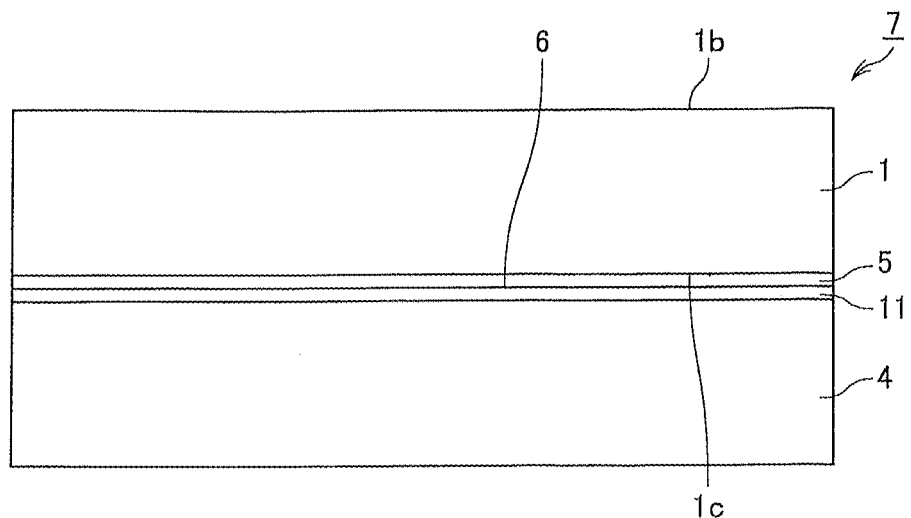
FIG. 3($a$) shows a bonded body 7 obtained by directly bonding the piezoelectric material substrate 1 and supporting substrate 4, FIG. 3($b$) shows the state that a piezoelectric material substrate 1A of the bonded body is thinned by polishing, and FIG. 3($c$) shows an acoustic wave device 10.
Figure 3B:
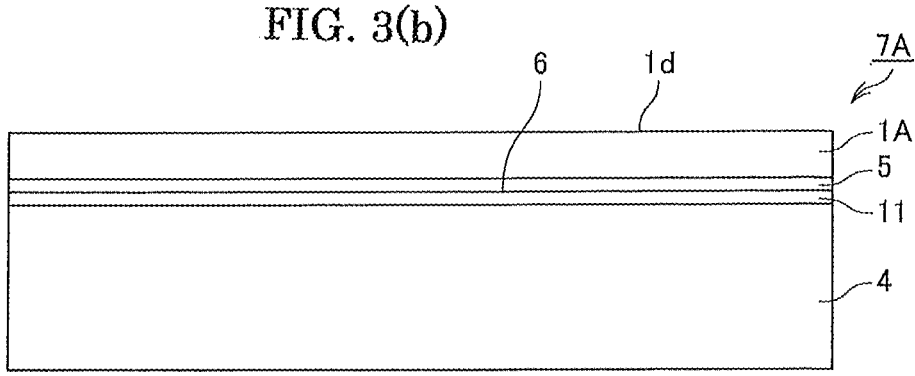
Figure 3C:
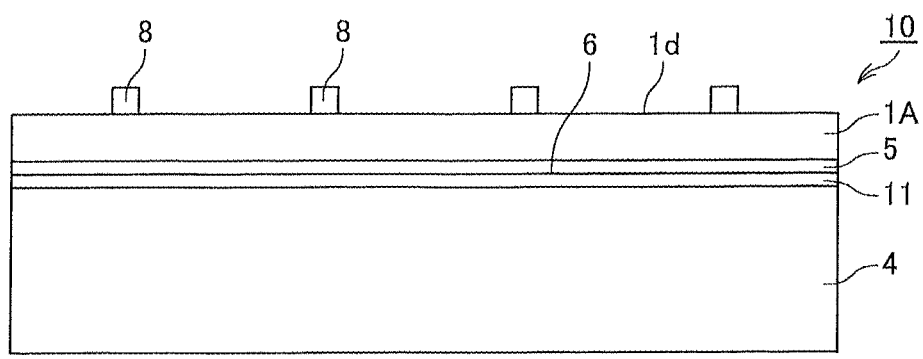

Then, as shown in FIG. 3($a$), the activated bonding surface 1$c$ on the piezoelectric material substrate 1 and activated bonding surface 6 of the supporting substrate 4 are contacted and directly bonded with each other, to obtain a bonded body. The thus obtained bonded body is heated, for example at 1000° C., to obtain a bonding strength which can endure the grinding process. The piezoelectric substrate of the bonded body is then thinned by a grinding machine. The bonded body is then subjected to thermal treatment at a temperature of 250° C. or higher and 350° C. or lower to obtain a bonded body 7. Here, a second amorphous layer 11 and first amorphous layer 5 are generated between the supporting substrate 4 and piezoelectric material substrate 1. At this stage, an electrode may be provided on the piezoelectric material substrate 1. However, preferably, as shown in FIG. 3($b$), the main surface 1$b$ of the piezoelectric material substrate 1 is processed to thin the substrate 1, to obtain a thinned piezoelectric material substrate 1A. 1$d$ represents a processed surface. Then, as shown in FIG. 3($c$), predetermined electrodes 8 are formed on the processed surface 1$d$ of the piezoelectric material substrate 1A of a bonded body 7A to obtain an acoustic wave device 10.

The respective constituents of the present invention will be described in the order.

The material of the supporting substrate 4 is made quartz. Quartz is a crystal having anisotropy, and the performance of a piezoelectric device is dependent on the crystal orientation. According to the non-patent document 1, spurious is suppressed by noting the acoustic velocity. It is thus possible to appropriately select the orientation so that desired performance can be obtained.

The piezoelectric material substrate 1 used in the present invention may preferably be composed of lithium tantalate (LT), lithium niobate (LN), or lithium niobate-lithium tantalate solid solution. As the materials have high propagation speed of an acoustic wave and large electromechanical coupling factor, they are suitable for a surface acoustic wave device of a high frequency and wide-band frequency application.

Further, although the normal line direction of the main surfaces 1$a$ and 1$b$ of the piezoelectric material substrate 1 is not particularly limited, for example, in the case that the piezoelectric material substrate 1 is made of LT, it is preferred to use the substrate rotated from Y-axis toward Z-axis by 32 to 55° ((180°, 58 to 35°, 180°) on Euler angle representation) around X-axis, which is a direction of propagation of a surface acoustic wave, because of a low propagation loss. In the case that the piezoelectric material substrate 1 is made of LN, (i) it is preferred to use the substrate rotated from Z axis toward −Y-axis by 37.8° ((0°, 37.8°, 0°) on Euler angle representation) around X-axis, which is the direction of propagation of the surface acoustic wave, because of a larger electromechanical coupling factor. Alternatively, (ii) it is preferred to use the substrate rotated from Y axis toward Z axis by 40 to 65° ((180°, 50 to 25°, 180°) on Euler angle representation) around X-axis, which is the direction of propagation of the surface acoustic wave, because of a high acoustic velocity. Further, although the size of the piezoelectric material substrate 1 is not particularly limited, for example, the diameter may be 100 to 200 mm and thickness may be 0.15 to 1 μm.

Plasma is then irradiated onto the surface of the piezoelectric material substrate and surface of the supporting substrate to activate the respective surfaces.

The atmosphere during the surface activation is made atmosphere containing oxygen. The atmosphere may be composed of oxygen only, nitrogen only, or mixed gases of oxygen and nitrogen, hydrogen gas and argon. In the case of the mixed gases, the ratio can be appropriately adjusted in relation to the bonding strength, although the ratio is not particularly limited.

The pressure of the atmosphere during the surface activation may preferably be 100 Pa or lower and more preferably be 80 Pa or lower. Further, the pressure of the atmosphere may preferably be 30 Pa or higher and more preferably be 50 Pa or higher.

The temperature during plasma irradiation is made 150° C. or lower. It is thus possible to obtain a bonded body 7 having a high bonding strength and without deterioration of piezoelectric material. On the viewpoint, the temperature during the plasma irradiation is made 150° C. or lower, and may preferably be made 100° C. or lower.

Further, the energy of the plasma irradiation may preferably be 30 to 150 W. Further, the product of the energy and irradiation time duration of the irradiated plasma may preferably be 0.1 to 1.0 Wh.

According to a preferred embodiment, before the surface activation treatment, the bonding surface 1a of the piezoelectric material substrate and surface 4a of the supporting substrate are subjected to flattening process. The method of flattening the respective surfaces 1a and 4a may be lapping, chemical mechanical polishing (CMP) and the like. Further, the flattened surfaces may preferably have Ra of 1 nm or lower and more preferably be 0.3 nm or lower.

Then, the activated surface of the piezoelectric material substrate and the activated surface of the supporting substrate are contacted and bonded with each other. Thereafter, the bonded body is preferably subjected to thermal treatment to provide a bonding strength which can endure the polishing process of the piezoelectric material substrate. The temperature of the thermal treatment may preferably be 100 to 150° C. According to the present embodiment, the piezoelectric material substrate may be subjected to polishing process to reduce the thickness after the thermal treatment.

The bonded body is then subjected to thermal treatment (annealing treatment) to improve the bonding strength. On the viewpoint of the present invention, the temperature during the thermal treatment is 250° C. or higher and may more preferably be 270° C. or higher. Further, the temperature during the thermal treatment may preferably be 350° C. or lower and more preferably be 300° C. or lower, for preventing the fracture of the bonded body.

According to the present invention, the first amorphous layer contains 10 to 30 atom % of silicon atoms. The content of silicon atoms of the first amorphous layer may more preferably be 15 atom % or higher and more preferably be 25 atom % or lower.

Further, the second amorphous layer contains 1 to 10 atom % of fluorine atoms. The content of fluorine atoms of the second amorphous layer may preferably be 3 atom % or higher, and the content of fluorine atoms of the second amorphous layer may preferably be 8 atom % or lower.

According to a preferred embodiment, the piezoelectric material substrate is composed of a material selected from the group consisting of lithium niobate, lithium tantalate and lithium niobate-lithium tantalate, and the first amorphous layer contains silicon atoms and atoms constituting the material as main components. In this case, the atoms constituting the material of the piezoelectric material substrate are one or two kinds of atoms selected from the group consisting of niobium and tantalum, lithium and oxygen. However, as it is impossible to directly measure the ratio of lithium according to the method described in the specification, the ratio of lithium is excluded from the respective ratios of the respective atoms constituting the material.

According to the present embodiment, a total of the ratios of the one or two kinds of atoms selected from the group consisting of niobium and tantalum and oxygen atoms of the first amorphous layer may preferably be 70 atom % or higher and more preferably be 90 atom % or lower. Further, a total ratio of the one or two kinds of atoms selected from the group consisting of niobium and tantalum of the first amorphous layer may more preferably be 75 atom % or higher and may more preferably be 85 atom % or lower. Further, the ratio of oxygen atoms of the first amorphous layer may more preferably be 60 atom % or lower and more preferably be 50 atom % or lower.

Further, according to a preferred embodiment, the second amorphous layer contains fluorine atoms, silicon atoms and oxygen atoms as main components. According to the present embodiment, preferably, the ratio of silicon atoms of the second amorphous layer may more preferably be 35 atom % or higher and may more preferably be 50 atom % or lower. Further, the ratio of oxygen atoms of the second amorphous layer may more preferably be 45 atom % or higher and may more preferably be 60 atom % or lower.

The concentrations of the respective atoms are measured by EDX method (energy distribution type X-ray analyzing method). "JEM-ARM200F" supplied by JEOL Ltd. is used as the EDX measurement system. The acceleration voltage is made 200 kV and beam size is made about 0.1 nmφ.

The thickness of the first amorphous layer may preferably be 1.0 nm to 3.0 nm, on the viewpoint of the present invention. Further, the thickness of the second amorphous layer may preferably be 4 to 10 nm and more preferably be 6 to 8 nm, on the viewpoint of the present invention. Further, the presence and thickness of each of the first amorphous layer and second amorphous layer can be confirmed by observing the cross section of the composite substrate by means of a high-resolution transmission type electron microscope (magnification of 8,000,000 folds.)

According to the present invention, when the piezoelectric material substrate is thinned by the processing, it is possible to suppress the separation of the piezoelectric material substrate from the supporting substrate. Thus, on the viewpoint of the performance of the composite substrate, particularly acoustic wave device, the thickness of the piezoelectric material substrate may preferably be 2.0 μm or smaller and more preferably be 1.0 μm or smaller. Although the lower limit of the thickness of the piezoelectric material substrate is not particularly limited, the thickness may made 0.05 μm or larger, on the viewpoint of the actual processing. Further, the thickness of the piezoelectric material substrate is measured by means of an optical type measuring machine ("F20" supplied by Filmetrix corporation) applying optical interference.

The bonded bodies 7 and 7A of the present invention can be appropriately used for the acoustic wave device 10.

As the acoustic wave device 10, a surface acoustic wave device, Lamb wave-type device, thin film resonator (FBAR) and the like are known. For example, the surface acoustic wave device is produced by providing input side IDT (Interdigital transducer) electrodes (also referred to as comb electrodes or interdigitated electrodes) for oscillating surface acoustic wave and IDT electrodes on the output side for receiving the surface acoustic wave on the surface of the piezoelectric single crystal substrate. By applying high frequency signal on the IDT electrodes on the input side, electric field is generated between the electrodes, so that the surface acoustic wave is oscillated and propagated on the piezoelectric material substrate. Then, the propagated surface acoustic wave is drawn as an electrical signal from the IDT electrodes on the output side provided in the direction of the propagation.

The material forming the electrodes (electrode pattern) 8 on the piezoelectric material substrate 1A may preferably be aluminum, aluminum alloy, copper or gold and more preferably be aluminum or aluminum alloy. The aluminum alloy used may preferably be Al doped with 0.3 to 5 weight percent of Cu. In this case, Ti, Mg, Ni, Mo, or Ta may be used instead of Cu.

EXAMPLES

Inventive Example 1

It was produced a surface acoustic wave device, according to the procedure described referring to FIGS. 1 to 3.

Specifically, a 42Y-cut X-propagation LiTaO$_3$ substrate (piezoelectric material substrate) 1 having thickness of 250 μm with both surfaces mirror polished and an AT-cut quartz substrate (supporting substrate) 4 having a thickness of 350 μm were prepared. The sizes of the substrates were 100 mm, respectively. Then, the surface 1a of the piezoelectric material substrate 1 and surface 4a of the supporting substrate 4 were subjected to cleaning and surface activation, respectively.

Specifically, ultrasonic cleaning by pure water was performed and the surfaces of the substrates were dried by spin drying. Then, the supporting substrate after the cleaning was introduced into a plasma activation chamber and the bonding surface was activated by oxygen gas plasma at 30° C. Further, the piezoelectric material substrate was similarly introduced into the plasma activation chamber and the bonding surface was subjected to surface activation by oxygen gas plasma at 30° C. Each time duration of the surface activation was made 40 seconds, and each energy was made 100 W. For removing particles attached during the surface activation, the ultrasonic cleaning and spin drying as described above were performed again.

Figure 4:
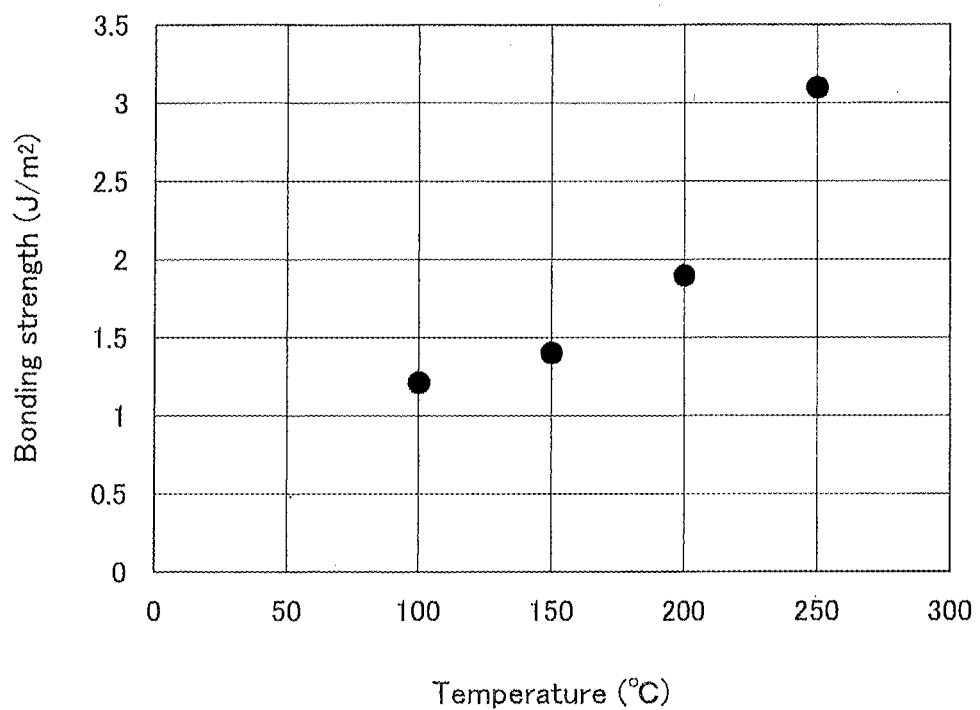
FIG. 4 is a graph showing an example of the relationship between the heating temperature and bonding strength after the direct bonding.

The positions of the respective substrates were then adjusted so that the activated bonding surfaces of the respective substrates were contacted with each other at room temperature. As the central parts of the laminated substrates were pressurized, it was observed the state (so-called bonding wave) that the adhesion of the substrates was spreading to prove that good preliminary bonding was accomplished. Then, the bonded body was charged into an oven filled with nitrogen atmosphere over 10 hours. As the relationship between the thermal treatment temperature and bonding strength was researched, it was obtained data shown in FIG. 4. It is necessary to make the thickness of the piezoelectric material very thin for realizing a SAW filter having high performance obtained by bonding the piezoelectric material and quartz. Very strong bonding is necessary for realizing such structure by CMP. Specifically, a bonding strength of 3 J/m$^2$ or larger is necessary. According to the present example, it is proved that it is necessary the thermal treatment temperature of 250° C. or higher. Further, the bonding strength was evaluated by blade method described in the non-patent document 3.

The piezoelectric material substrate of the bonded body after the thermal treatment at 100° C. over 10 hours was processed by a grinding machine to a thickness of 10 μm. The processed substrate was heated at 250° C. for 10 hours more. Then, the substrate was set in a lapping machine and processed until the thickness reached 5 μm, while diamond slurry was supplied. Finally, it was polished by a CMP processing machine for performing the removal of the processing denatured layer and final adjustment of the thickness. Colloidal silica was supplied as slurry for polishing. As the substrate was taken out after the polishing, the separation of the piezoelectric material substrate was not observed, confirming that very strong bonding was realized.

As the thickness of the piezoelectric material substrate was measured by an optical type measuring system ("F20" supplied by Filmetrix corporation, "F20") by optical interference, it was obtain a very thin layer of 2 μm.

As the CMP was continued for studying the limit of the thickness of the piezoelectric material substrate, the separation was not observed even when the thickness of the piezoelectric material substrate reached 0.3 μm.

Figure 5:
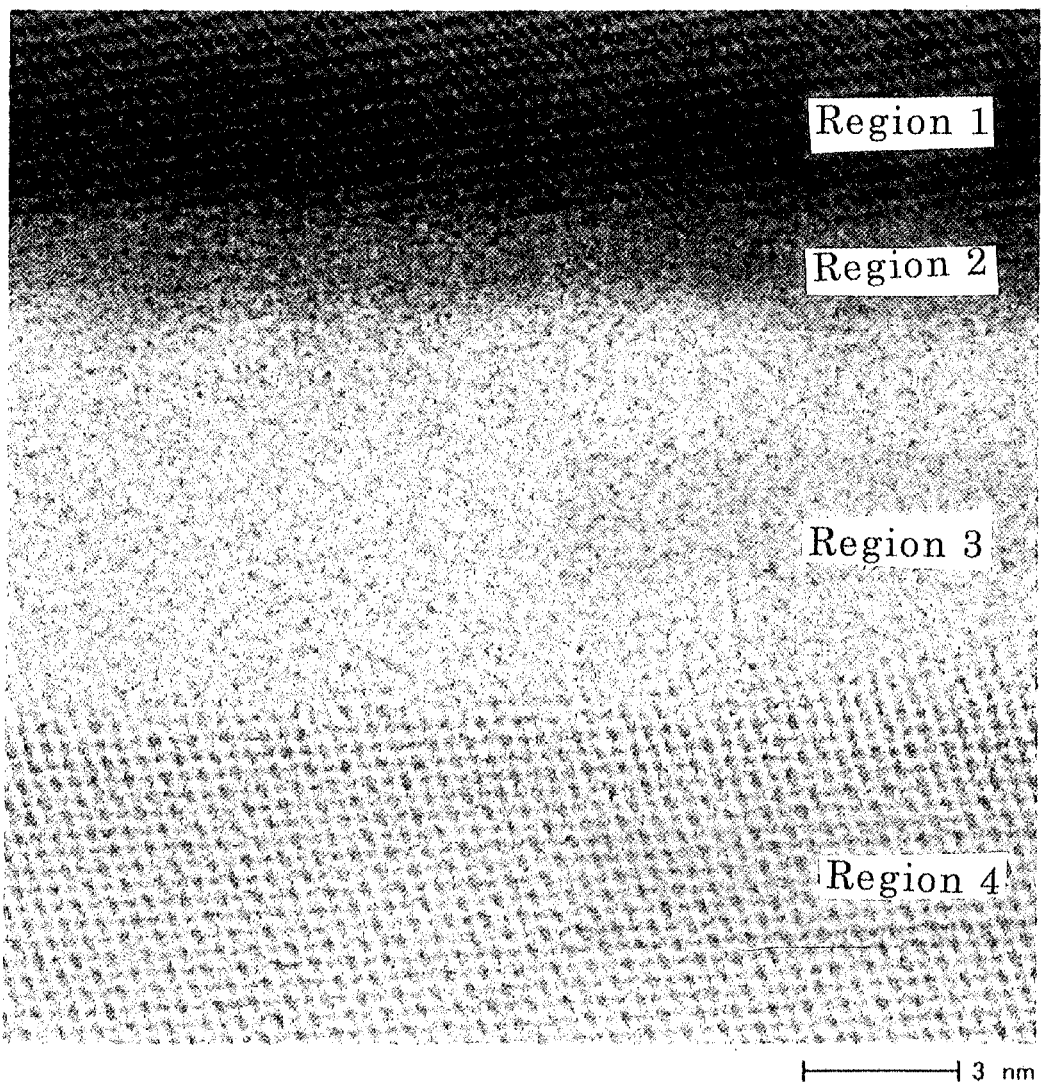
FIG. 5 is a photograph showing the vicinity of the interface of the composite substrate taken by a high-resolution transmission type electron microscope (8,000,000 folds).

As the cross section of the bonding interface of the inventive example 1 was analyzed by means of a high-resolution TEM (system; "JEM-ARM200F", acceleration voltage; 200 kV, magnification; 8,000,000 folds), an amorphous layer was observed (FIG. 5). Further, as the amorphous layer is observed in detail, it was proved that it was divided into two layers.

That is, in FIG. 5, a region 1 represents an end part of the piezoelectric material substrate composed of lithium tantalate single crystal, and a region 4 represents the supporting substrate composed of silicon oxide. The region 1 is darker than the region 4, because a large amount of tantalum atoms having a large molecular weight is present therein. Then, a region 2 represents a first amorphous layer, and a region 3 represents a second amorphous layer.

EDX analysis was performed according to the following conditions, for studying the compositions of the respective amorphous layers. The results of the measurements were shown in table 1.

Transmission electron microscope: "HD-2700" supplied by Hitachi High-Technologies Corporation.
Acceleration voltage: 200 kV
Beam size: about 0.2 nmφ
Elementary analysis system: "Genesis" supplied by EDAX
X-ray detector: Si/Li semiconductor detector
Energy resolution: about 140 eV
X-ray extraction angle: 25.7°
Solid angle: 0.31 sr
Extraction time: 30 sec

TABLE 1

| | Inventive Example 1 | | | |
| --- | --- | --- | --- | --- |
| | Concentrations of atoms (atom %) | | | |
| | O | Si | Ta | F |
| First amorphous layer | 65 | 20 | 15 | 0 |
| Second amorphous layer | 52 | 43 | 0 | 5 |
| Thickness of first amorphous layer | | 1.7 nm | | |
| Thickness of second amorphous layer | | 7.5 nm | | |
| Bonding strength (J/m$^2$) | | 3.0 | | |
| Thickness at which piezoelectric material substrate is not separated (μm) | | 0.3 | | |

Inventive Example 2

Please of mixed gases containing 80% of nitrogen gas and 20% of oxygen gas was used instead of the oxygen gas plasma in the inventive example 1. In changing the gas composition, the matching was appropriately changed so that the reflection voltage of RF takes the minimum.

The bonded body was processed according to the same procedure as the inventive example 1, except the above. As a result, a large bonding strength of 3.2 J/m² was measured after the heating at 250° C. as the inventive example 1. The separation did not occur also in this substrate, even when the thickness of the piezoelectric layer is made 1 μm by CMP processing.

EDX analysis was performed as the inventive example 1, for studying the compositions of the amorphous layers of the thus obtained bonded body. The measurement results were shown in table 2.

TABLE 2

| | Inventive Example 2 | | | |
|---|---|---|---|---|
| | Concentrations of atoms (atom %) | | | |
| | O | Si | Ta | F |
| First amorphous layer | 62 | 23 | 13 | 0 |
| Second amorphous layer | 52 | 41 | 0 | 7 |
| Thickness of first amorphous layer | | 1.9 nm | | |
| Thickness of second amorphous layer | | 6.8 nm | | |
| Bonding strength (J/m²) | | 3.2 | | |
| Thickness at which piezoelectric material is not separated (μm) | | 1.0 | | |

Inventive Example 3

The heating temperature of the bonded body was changed from 250° C. to 270° C. in the inventive example 1. As the thus obtained bonded body was subjected to polishing treatment as the inventive example 1, and the separation was not observed even in the case that it was subjected to the CMP processing to a thickness of 0.3 μm.

As the cross section of the bonding interface of the inventive example 3 was analyzed by means of the high-resolution TEM as the inventive example 1, the first amorphous layer and second amorphous layer were observed along the bonding interface. EDX analysis was performed under the conditions same as those of the inventive example 1, for studying the compositions of the respective amorphous layers. The measurement results were shown in table 3.

TABLE 3

| | Inventive Example 3 | | | |
|---|---|---|---|---|
| | Concentrations of atoms (atom %) | | | |
| | O | Si | Ta | F |
| First amorphous layer | 65 | 20 | 15 | 0 |
| Second amorphous layer | 53 | 43 | 0 | 4 |
| Thickness of first amorphous layer | | 2.3 nm | | |
| Thickness of second amorphous layer | | 7.9 nm | | |
| Bonding strength (J/m²) | | 2.9 | | |
| Thickness at which piezoelectric material substrate is not separated (μm) | | 0.3 | | |

As such, according to the inventive examples, it was proved that first amorphous layer and second amorphous layer each having a specific composition were generated. Further, it is considered that fluorine atoms in the composition are derived from fluorine-based rubber (perfluoro carbon polymer) constituting an O-ring of the plasma treatment chamber.

Comparative Example 1

Neutralized argon beam was applied to perform the surface activation instead of oxygen plasma in the inventive example 1. The time duration was made 60 second for each of the quartz and piezoelectric material substrates. Wafers were contacted and bonded with each other in a vacuum chamber of a bonding machine upon pressure, to obtain a bonded body. The thus drawn wafer was charged into the oven at 100° C. as the inventive example 1, and taken out 10 hours after. Although it was tried to perform the processing by a grinding machine until the thickness of the piezoelectric material substrate reached 10 μm, the grinding machine was changed to error mode at the time that the processing reached about 20 μm. As the wafer was taken out, the piezoelectric material was substantially separated. It was thus proved that only a very low bonding strength was obtained.

Comparative Example 2

The plasma activation was performed as the inventive example 1 except that the maximum heating temperature was made a low temperature of 150° C. to produce a bonded body, which was then subjected to the CMP processing. The piezoelectric material substrate was separated at the time that the thickness thereof reached about below 5um.

The TEM analysis and EDX analysis were performed as the inventive example 1, for studying the compositions of the amorphous layers of the thus obtained bonded body. The measurement results were shown in table 4. As the heating temperature would be low, the compositions were different from those of the inventive examples.

Further, it was proved that the thicknesses of the amorphous layers were very small.

TABLE 4

| | Comparative Example 2 | | | |
|---|---|---|---|---|
| | Concentrations of atoms (atom %) | | | |
| | O | Si | Ta | F |
| First amorphous layer | 70 | 2 | 28 | 0 |
| Second amorphous layer | 55 | 44 | 0 | 1 |

TABLE 4-continued

Comparative Example 2

| | Concentrations of atoms (atom %) | | | |
|---|---|---|---|---|
| | O | Si | Ta | F |
| Thickness of first amorphous layer | | 0.5 nm | | |
| Thickness of second amorphous layer | | 2.0 nm | | |
| Bonding strength (J/m$^2$) | | 1.3 | | |
| Thickness at which piezoelectric material substrate is not separated (μm) | | 5 | | |

The invention claimed is:

1. A composite substrate comprising:
a supporting substrate comprising quartz;
a piezoelectric material substrate;
a first amorphous layer present between said supporting substrate and said piezoelectric material substrate; and
a second amorphous layer present between said supporting substrate and said first amorphous layer,
wherein said first amorphous layer contains 10 to 30 atom % of silicon atoms, and
wherein said second amorphous layer contains 1 to 10 atom % of fluorine atoms.

2. The composite substrate of claim 1,
wherein said piezoelectric material substrate comprises a material selected from the group consisting of lithium niobate, lithium tantalate and lithium niobate-lithium tantalate; and
wherein said first amorphous layer comprises said silicon atoms and atoms constituting said material as main components.

3. The composite substrate of claim 1, wherein said second amorphous layer comprises said fluorine atoms, silicon atoms and oxygen atoms as main components.

4. The composite substrate of claim 1,
wherein said first amorphous layer has a thickness of 1 nm to 3 nm; and
wherein said second amorphous layer has a thickness of 4 to 10 nm.

5. An acoustic wave device comprising:
the composite substrate of claim 1; and
an electrode on said piezoelectric material substrate.

* * * * *